(12) United States Patent
Tseng

(10) Patent No.: US 6,423,633 B1
(45) Date of Patent: Jul. 23, 2002

(54) METHOD FOR MANUFACTURING DIFFUSION BARRIER LAYER

(75) Inventor: Horng-Huei Tseng, Hsinchu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/670,204

(22) Filed: Sep. 25, 2000

Related U.S. Application Data

(63) Continuation-in-part of application No. 09/546,407, filed on Apr. 10, 2000.

(51) Int. Cl.$^7$ ............................................. H01L 21/44
(52) U.S. Cl. ...................... 438/653; 438/585; 438/588; 438/591; 438/592
(58) Field of Search ................................ 438/585, 588, 438/591, 592, 653

(56) References Cited

U.S. PATENT DOCUMENTS 6,080,645 A * 6/2000 Pan ............................. 438/585
6,204,111 B1 * 3/2001 Uemoto et al. ............. 438/239

* cited by examiner

*Primary Examiner*—David Nelms
*Assistant Examiner*—Reneé R Berry
(74) *Attorney, Agent, or Firm*—J.C. Patents

(57) ABSTRACT

A method for manufacturing a diffusion barrier layer over a substrate having a patterned copper layer. A refractory metal layer is formed on the substrate and a top surface and a sidewall of the patterned copper layer. The refractory metal layer is converted into an implanted layer as a diffusion barrier layer, where gas of $N_2$, $O_2$, or $N_2O$ are used for producing implanting ions. A thermal process is performed to stabilize a diffusion barrier quality of the oxygen-containing implantation layer.

12 Claims, 2 Drawing Sheets

METHOD FOR MANUFACTURING DIFFUSION BARRIER LAYER

CROSS-REFERENCE TO RELATED APPLICATION

The present application is a continuation in part of Applicant's application Ser. No. 09/546,407 filed Apr. 10, 2000, entitled "METHOD FOR MANUFACTURING DIFFUSION BARRIER LAYER", currently pending. All these applications are incorporated herein by this reference, which is not admitted to be prior art with respect to the present invention by its mention in the background.

BACKGROUND OF THE INVENTION

1. Field of Invention

The present invention relates to a method for manufacturing an interconnect. More particularly, the present invention relates to a method for manufacturing a diffusion barrier layer to block copper atoms diffusing from the copper wires.

2. Description of Related Art

In the procedure for manufacturing an ultra large scale integration circuit, more than one hundred thousand transistors are disposed on a silicon surface with an area of only about 1 to 2 square centimeters. Additionally, in order to increase the integration of the integrated circuit, the density of the conductive wire used to electrically connect the transistors and the devices with each other are also increased. Therefore, in accord with the increased interconnects manufacturing requirements of miniaturized transistors, it is increasingly necessary for IC manufacturing to adopt a design with more than two metal layers. In particular, a number of multi-function products, such as microprocessors, even require 4 or 5 metal layers to complete the internal connections thereof.

With the decreasing size of the device, the distance between the adjacent conductive wires is decreased. In the extremely narrow space, unexpected capacitive and inductive coupling occurs between the parallel conductive wires and the capacitive and inductive coupling leads to interference between the conductive wires. Due to the interference between the conductive wires, the resistance-capacitance time delay (RC time delay) between the conductive wires is increased. The data transmission rate is especially repressed by the capacitive and inductive coupling when the data are to transmitted through the parallel conductive wires at a relatively high transmission rate. Hence, the energy waste is greatly increased and the efficiency of the device is limited.

Copper is currently the substitute of choice for aluminum interconnect material, because its high anti-electromigration and low resistance permit a decreased time delay of signal transmission Therefore, the resistance of the conductive wire can be decreased.

However, the use of copper as an interconnection material presents several problems. For example, copper oxidizes easily at low temperatures and copper diffuses easily into silicon dioxide and other dielectric materials used in microcircuitry. Therefore, in order to overcome the disadvantages of using copper wires, it is necessary to passify surfaces of copper wires and provide diffusion barrier layers between copper and adjacent layers.

SUMMARY OF THE INVENTION

The invention provides a method of manufacturing a diffusion barrier layer. A substrate having a patterned copper layer formed thereon is provided. A surface of the patterned copper layer is converted into a copper-containing implantation layer.

The step of converting the surface of the patterned copper layer comprises a step of performing an implantation process to introduce a plurality of atoms into the surface of the patterned copper layer. Additionally, the atoms introduced into the surface of the patterned copper layer include oxygen atoms, nitrogen atoms or a mixture of atoms comprising oxygen atoms and nitrogen atoms.

Because of the formation of the copper-containing implantation layer, the copper atoms of the patterned copper layer can be blocked by the copper-containing implantation layer. Additionally, the dosage of the atoms introduced into the patterned copper layer by the implantation process can be controlled.

The invention also provides a method for manufacturing a diffusion barrier layer over a substrate having a patterned copper layer. A refractory metal layer is formed on the substrate and a top surface and a sidewall of the patterned copper layer. The refractory metal layer is converted into an oxygen-containing implantation layer as a diffusion barrier layer. A thermal process is performed to stabilize a diffusion barrier quality of the oxygen-containing implantation layer.

As embodied and broadly described herein, the step of converting the refractory metal layer into the oxygen-containing implantation layer includes an implantation process to introduce a plurality of atoms into the refractory metal layer. Moreover, the atoms introduced into the refractory metal layer include oxygen atoms, nitrogen atoms or a mixture of atoms comprising oxygen atoms and nitrogen atoms. Incidentally, the oxygen-containing implantation layer includes an oxygen-containing titanium nitride layer and the refractory metal layer is formed from titanium by deposition.

Because of the formation of the oxygen-containing implantation layer, the copper atoms of the patterned copper layer can be blocked by the oxygen-containing implantation layer. Additionally, the percentage of the oxygen atoms in the oxygen-containing implantation layer formed by the implantation process can be controlled. Therefore, the diffusion barrier efficacy of the oxygen-containing implantation nitride layer can be precisely controlled.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Embodiments of the invention provide a method for forming a diffusion dielectric layer of the patterned copper layer. Certain embodiments of the invention provide a treatment for the surface of the patterned copper layer including an implantation process to introduce atoms into the surface of the patterned copper layer. The surface of the patterned copper layer is converted into a copper-containing implantation layer as a diffusion barrier layer. Certain embodiments of the invention provide a method for forming a diffusion barrier layer to cover the patterned copper layer. The method comprises the steps of forming a refractory metal layer over a substrate having a patterned copper layer formed thereon, introducing atoms into the refractory metal layer and performing a thermal process to transfer the atom-containing refractory layer into a diffusion barrier layer.

Figure 1A:
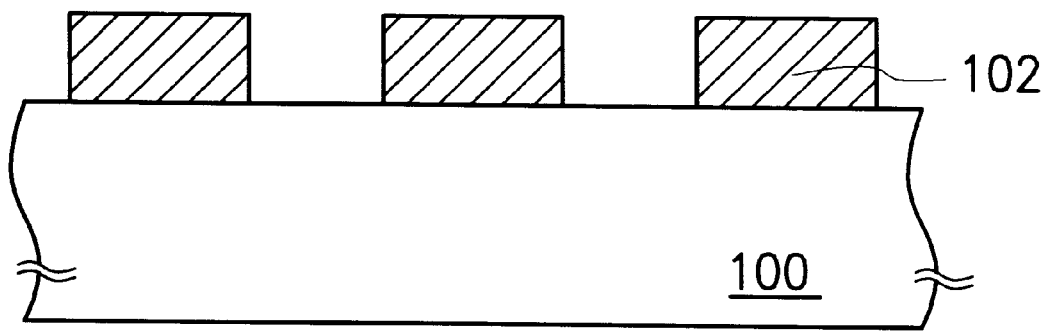
FIGS. 1A through 1B are schematic, cross-sectional views of the process for manufacturing a diffusion barrier layer of the patterned copper layer in a preferred embodiment according to the invention.
Figure 1B:
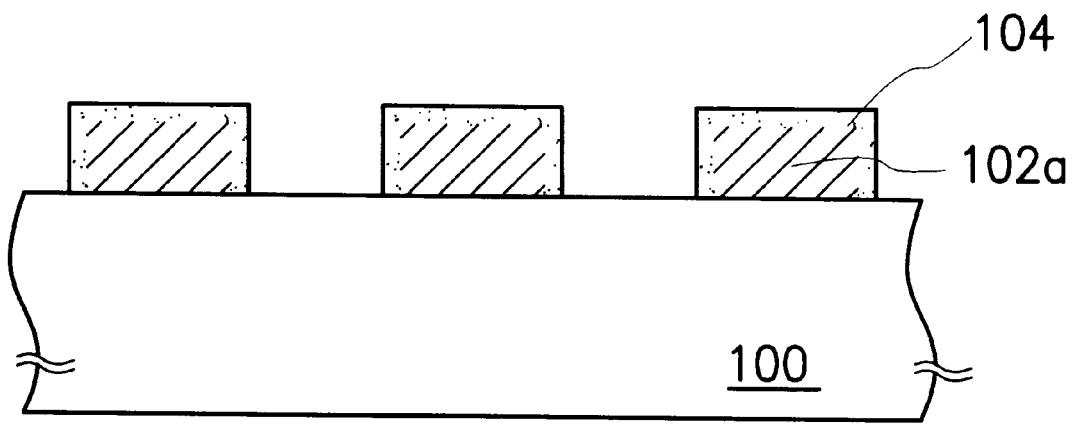

FIGS. 1A through 1B are schematic, cross-sectional views of the process for manufacturing a diffusion barrier layer of the patterned copper layer in a preferred embodiment according to the invention.

As shown in FIG. 1A, a substrate 100 comprising multiple devices (not shown) formed therein and multiple dielectric layers (not shown) formed thereon are provided. A patterned copper layer 102 is formed on the substrate 100. The patterned copper layer 102 can be formed by patterning a copper layer (not shown) on the substrate 100. Alternatively, the patterned copper layer 102 can be formed by the steps of defining a pattern of features, such as trenches or vias in a dielectric layer (not shown), filling the features by a copper layer (not shown) and removing the excess copper layer. The patterned copper layer 102 generally is an interconnecting structure.

As shown in FIG. 1B, an implantation process is performed to introduce several atoms into the surface of the patterned copper layer 102. Hence, the surface of the patterned copper layer 102 is converted into a copper-containing implantation layer 104 which serves as a diffusion barrier layer. The atoms can be oxygen, nitrogen or a mixture of atoms including oxygen and nitrogen, for example. In order to produce the oxygen atoms, a gas source of, for example, $O_2$, $N_2O$, or $NO_2$ can be applied. In order to produce the nitrogen atoms, a gas source of, for example, $N_2$, $N_2O$, or $NO_2$ can be applied.

Because of the formation of the copper-containing implantation layer 104, the copper atoms of the patterned copper layer 102a can be blocked by the copper-containing implantation layer 104. Additionally, the dosage of the atoms introduced into the patterned copper layer by the implantation process can be controlled. Therefore, the diffusion barrier efficacy of the copper-containing implantation layer 104 can be precisely controlled.

Figure 2A:
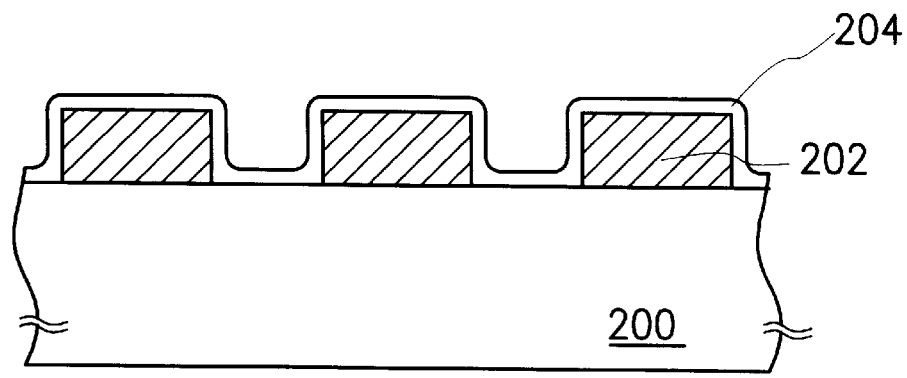
FIGS. 2A through 2C are schematic, cross-sectional views of the process for manufacturing a diffusion barrier layer to cover the patterned copper layer in another preferred embodiment according to the invention.
Figure 2B:
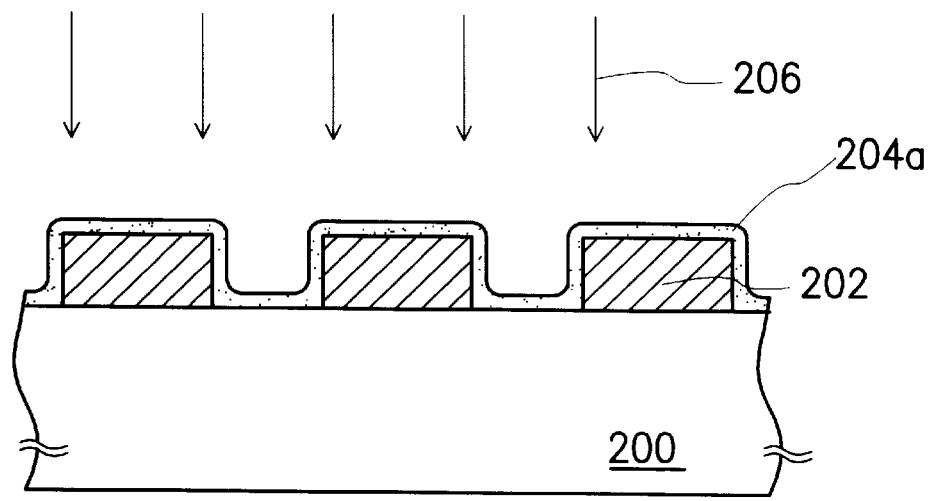
Figure 2C:
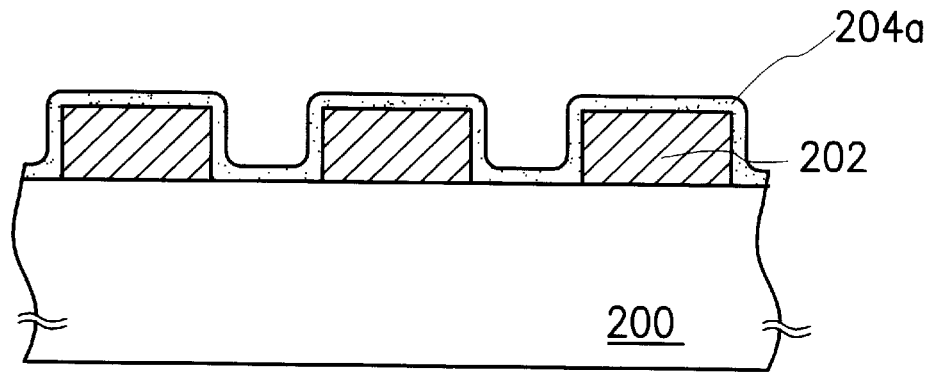

FIGS. 2A through 2C are schematic, cross-sectional views of the process for manufacturing a diffusion barrier layer to cover the patterned copper layer in another preferred embodiment according to the invention.

As shown in FIG. 2A, a substrate 200 comprising multiple devices (not shown) formed therein and multiple dielectric layers (not shown) formed thereon is provided. A patterned copper layer 202 is formed on the substrate 200. The patterned copper layer 202 can be formed by patterning a copper layer (not shown) on the substrate 200. Alternatively, the patterned copper layer 202 can be formed by the steps of defining a pattern of features, such as trenches or vias in a dielectric layer (not shown), filling the features by a copper layer (not shown) and removing the excess copper layer. The patterned copper layer 202 generally is an interconnecting structure.

A refractory metal layer 204 is formed over the substrate 200 and covers the top surface and the sidewall of the patterned copper layer 202. The refractory metal layer 204 can be formed from titanium by deposition, for example.

As shown in FIG. 2B, an implantation process 206 is performed to introduce atoms into the refractory metal layer 204. Hence, the refractory metal layer 204 is converted into an implantation layer 204a for use as a diffusion barrier layer. The atoms introduced into the refractory layer 204 can be oxygen atoms, nitrogen atoms or a mixture of atoms including oxygen atoms and nitrogen atoms, for example. Moreover, the implantation layer 204a can be an oxygen-containing implantation layer or a nitrogen-containing implantation layer, for example. In order to produce the oxygen atoms for implantation, a gas source of, for example, $O_2$, $NO_2$, or $N_2O$ can be applied. In order to produce the nitrogen atoms for implantation, a gas source of, for example, $N_2$, $NO_2$, or $N_2O$ can be applied. Preferably, the implantation layer 204a can be an oxygen-containing titanium nitride layer.

As shown in FIG. 2C, a thermal process is performed in an environment full of argon or nitrogen gas to stabilize the quality of the implantation layer 204a.

Because of the formation of the implantation layer 204a, the copper atoms of the patterned copper layer 202 can be blocked by the implantation layer 204a. Additionally, the percentage of the oxygen atoms in the oxygen-containing titanium nitride layer formed by the implantation process can be controlled. Therefore, the diffusion barrier efficacy of the oxygen-containing titanium nitride layer can be precisely controlled.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a diffusion barrier layer, comprising the steps of:

providing a substrate having a patterned copper layer formed thereon;

performing an implantation process to directly introduce a plurality of atoms into a surface of the patterned copper layer, wherein the atoms are provided by an implantation gas comprises one selected from a group consisting of $N_2$, $O_2$, $NO_2$, and $N_2O$; and performing a thermal process.

2. A method of manufacturing a diffusion barrier layer, comprising the steps of:

providing a substrate having a patterned copper layer formed thereon;

converting a surface of the patterned copper layer into a copper-containing implantation layer with implanted atoms which are provided by an implantation gas comprising one selected from a group consisting of $N_2$, $O_2$, $NO_2$, and $N_2O$; and performing a thermal process.

3. A method for manufacturing a diffusion barrier layer over a substrate having a patterned copper layer, the method comprising the steps of:

forming a refractory metal layer on the substrate and a top surface and a sidewall of the patterned copper layer;

performing an implantation process to convert the refractory metal layer into an implantation layer which serves as a diffusion barrier layer, wherein the implantation process comprises an implantation gas selected from a group consisting of $N_2$, $O_2$, $NO_2$, and $N_2O$; and performing a thermal process to stabilize a diffusion barrier quality of the implantation layer.

4. The method of claim 3, wherein the implantation layer includes an oxygen-containing titanium nitride layer.

5. The method of claim 3, wherein the refractory metal layer is formed from titanium by deposition.

6. A method for manufacturing a diffusion barrier layer over a substrate having a patterned copper layer, the method comprising the steps of:

forming a refractory metal layer on the substrate and a top surface and a sidewall of the patterned copper layer;

converting the refractory metal layer into an oxygen-containing implantation layer which serves as a diffusion barrier layer, wherein oxygen atoms of the oxygen-containing implantation layer are provided by a gas comprising one selected from a group consisting of $O_2$, $NO_2$, and $N_2O$; and performing a thermal process to stabilize a diffusion barrier quality of the oxygen-containing implantation layer.

7. The method of claim 6, wherein the oxygen-containing implantation layer includes an oxygen-containing titanium nitride layer.

8. The method of claim 6, wherein the refractory metal layer is formed from titanium by deposition.

9. The method of claim 1, wherein the surface of the patterned copper layer comprises a top surface and a sidewall of the patterned copper layer.

10. The method of claim 1, wherein implanting atoms into the surface of the patterned copper layer is to prevent copper from diffusing into a neighboring layer.

11. The method of claim 2, wherein the copper-containing implantation layer prevents a diffusion of copper into a neighboring layer.

12. The method of claim 6, wherein the method further comprises converting an entire refractory metal layer into a diffusion barrier layer.

* * * * *